United States Patent [19]

Casson et al.

[11] Patent Number: 5,261,593
[45] Date of Patent: Nov. 16, 1993

[54] DIRECT APPLICATION OF UNPACKAGED INTEGRATED CIRCUIT TO FLEXIBLE PRINTED CIRCUIT

[75] Inventors: Keith L. Casson, Northfield, Minn.; Kelly D. Habeck, Tampa, Fla.; Eugene T. Selbitschka, South St. Paul, Minn.

[73] Assignee: Sheldahl, Inc., Northfield, Minn.

[21] Appl. No.: 932,064

[22] Filed: Aug. 19, 1992

[51] Int. Cl.$^5$ .................................................. H05K 3/34
[52] U.S. Cl. .......................... 228/180.22; 228/248.1
[58] Field of Search ............... 228/180.1, 180.2, 201, 228/232, 239, 240, 248

[56] References Cited

U.S. PATENT DOCUMENTS

| | | | |
|---|---|---|---|
| 3,868,724 | 2/1975 | Perrino | 357/65 |
| 3,965,568 | 6/1976 | Gooch | 29/583 |
| 4,219,882 | 8/1980 | Cooper et al. | 365/2 |
| 4,425,401 | 1/1984 | Ido et al. | 428/329 |
| 4,628,406 | 12/1986 | Smith et al. | 361/386 |
| 4,647,959 | 3/1987 | Smith | 357/74 |
| 4,748,495 | 5/1988 | Kucharek | 357/82 |
| 4,772,936 | 9/1988 | Reding et al. | 357/80 |
| 4,774,634 | 9/1988 | Tate et al. | 361/400 |
| 4,814,855 | 3/1989 | Hodgson et al. | 174/52 |
| 4,862,153 | 8/1989 | Nakatani et al. | 340/719 |
| 4,878,098 | 10/1989 | Saito et al. | 357/68 |
| 4,967,950 | 11/1990 | Legg et al. | 228/180.2 |
| 4,980,034 | 12/1990 | Volfson et al. | 204/38 |
| 5,001,542 | 3/1991 | Tsukagoshi et al. | 357/68 |
| 5,008,997 | 4/1991 | Phy | 29/827 |
| 5,019,944 | 5/1991 | Ishii et al. | 361/400 |
| 5,021,630 | 6/1991 | Benko et al. | 219/121.64 |
| 5,033,665 | 7/1991 | Todd | 228/103 |
| 5,112,462 | 5/1992 | Swisher | 205/165 |
| 5,133,495 | 7/1992 | Angulus et al. | 228/180.1 |
| 5,203,075 | 4/1993 | Angulus et al. | 228/180.2 |

OTHER PUBLICATIONS

"Flip Chip Bonding Offers Packaging Alternative", *Hybrid Circuit Technology*, Mar. 1988, pp. 29–31.
"ASIC Flip Chips: Manufacture and Use", CSC ™ Cherry Semiconductor Literature.
"Recent Developments in Flip Chip Technology", *Surface Mount Technology*, Jul. 1991, pp. 41–42 and 44.

*Primary Examiner*—Samuel M. Heinrich
*Attorney, Agent, or Firm*—Merchant, Gould, Smith, Edell, Welter & Schmidt

[57] ABSTRACT

A method is described for electrically connecting flip chips to a flexible printed circuit substrate. The method comprises (1) providing solder paste to a plurality of active contact pads located on the flexible printed circuit substrate, (2) placing the flip chips on the substrate such that solder bumps located on the flip chips are in registration with the solder paste on the active contact pads, and (3) heating the resulting assembly as a whole so that the solder paste on each active contact pad reflows to form an electrical connection with its corresponding solder bump.

25 Claims, 4 Drawing Sheets

DIRECT APPLICATION OF UNPACKAGED INTEGRATED CIRCUIT TO FLEXIBLE PRINTED CIRCUIT

FIELD OF THE INVENTION

The invention is directed to a method for assembling electronic circuits. In particular the method is directed to electrically connecting unpackaged integrated circuit chips, flip chips, to a flexible printed circuit substrate using preferred heating/soldering techniques.

BACKGROUND OF THE INVENTION

Various methods for electrically connecting (i.e. attaching using an electrically-conductive bond to mechanically and electrically connect) unpackaged integrated circuits to printed circuit substrates are well known in the art. One such method uses "flip chips". A flip chip is an unpackaged integrated circuit chip whose bonding pads bear solder bumps which are substantially hemispherically-shaped solidified solder, typically made of a tin-lead composition. By unpackaged, we mean the flip chip has no plastic shell nor the metallic leads common in most integrated circuit packages. The active side of such a chip contains the active devices and bonding pads, and has a passivation layer that can protect its active components from environmental contaminants. The back side of such a chip, opposite to the active side, can contain markings indicating die part numbers and an electrical orientation for circuit application. The flip chips are so named because they are mounted with their active side facing down towards the circuit substrate.

One or more flip chips are electrically connected to a printed circuit substrate along with other electrical devices (e.g. resistors, capacitors) to form an electrical circuit. One or both sides of a printed circuit substrate can typically be used as an active side, which has an interconnection pattern of electrically conductive material (e.g. copper) in which to interconnect the various devices used in the circuit. For the purposes of flip chip attachment, the interconnection pattern has a number of contact pads defined thereon in connection footprints which correspond to the location and orientation of the solder bumps on a particular flip chip which may be attached to the printed circuit substrate. Of these contact pads, some are defined as active contact pads, each of which has a corresponding solder bump on a flip chip which is to be electrically connected to that active contact pad. Those contact pads which are not active pads are defined as inactive pads, which may or may not have corresponding solder bumps, and which are not functionally affected by an electrical connection process.

The most common use of flip chips is in connection with ceramic substrates containing interconnection patterns of palladium silver conductive traces. One method of connection used is controlled collapse chip connection (C-4) soldering, which involves registering the solder bumps of a flip chip on matching wettable solder contacts of the substrate, and then heating the solder to induce reflow and electrical connection between the chip and the substrate. By means of registration, we mean the placement of a flip chip on a substrate, such that each solder bump on the flip chip is located directly over its corresponding active contact pad, and such that the flip chip is in a position to be electrically connected without further movement of the flip chip or the substrate. The C-4 method is widely used, and has a significant advantage in that the shape of the solder bumps allows for the controlled collapse of a chip onto the substrate.

Ceramic substrates were first used with flip chips due to their ability to withstand a wider range of temperatures than other types of substrates. The C-4 method flip chip connection requires temperatures in excess of 320° C. to reflow the tin-lead solder bumps, which is within the operating range of most ceramic substrates. Many other types of substrates, such as organic, fiberglass, film, etc. are unable to withstand these temperatures, and therefore can not be used with the C-4 method.

Also, ceramic substrates were typically used with flip chips because of the quality of the electrical connections. The thermal coefficients of expansion of a ceramic substrate ($65 \times 10^{-7}$ (° /C.)) and silicon ($30 \times 10^{-7}$ (° /C.)) are similar enough to reduce the formation of any damaging shear forces, during heating/cooling cycles, between the chip and the substrate which could fracture the interconnects. For example, the shear forces for a silicon flip chip connected to a ceramic substrate constructed of alumina are:

$$E_{substrate} \times (TCE_{substrate} - TCE_{silicon\ die}) = psi/° C.$$

$$(37 \times 10^6 (psi)) \times (65 \times 10^{-7} (° /C.) - 30 \times 10^{-7} (° /C.)) = 129.5\ psi/° C.$$

This property of the ceramic substrates then allows for circuits using flip chips on ceramic substrates to be used in a wider range of environments (e.g., an automotive operating environment, which may range from −65° C. to 150° C.) than circuits using other substrates. However, as the quality of electrical connections is always a significant concern for circuit board assemblies (especially those subject to harsh environments), improvement in the quality is a major goal when devising a new process.

Though ceramic substrates were initially the sole choice for use with flip chips, escalating assembly pricing pressures made ceramic a less desirable choice for a substrate, and a need developed for more cost-efficient types of substrates, which also have high temperature tolerance and thermal expansion properties similar to silicon. Of the possible alternative types of substrates, a flexible substrate incorporating polyimide film and copper foil laminates has a preferred combination of properties needed to meet the requirements for flip chip applications. In addition, the fact that this type of substrate is flexible provides additional advantages over ceramic substrates, in that the circuits may be constructed to fit in smaller areas or more specialized applications. However, such substrates have traditionally required an adhesive layer to bond the copper foil to the polyimide dielectric film.

The adhesives used have generally been a weak link in the substrate system. Adhesive properties make the assembly sensitive to adverse effects of solvents and moisture and can make the assembly too sticky or too soft under certain operating conditions. Most importantly, the adhesive in a circuit assembly can result in a limited range of operating temperatures, which is below what is required to reflow solder bumps, and which prohibits the use of the traditional C-4 soldering technique. The composition of the C-4 solder cannot be easily altered to lower the reflow temperature, because other properties of the solder, such as surface tension, would be changed, compelling major modifications to the manufacturing process for applying the solder bumps to the flip chips.

One attempt at a solution to this problem is disclosed in Legg et al., U.S. Pat. No. 4,967,950. The method uses a thermode heat probe in contact with the flip chip to heat the solder. Legg at al. describes a eutectic alloy "tinned" onto the substrate which is miscible with the solder bump, and which has a melting point which is lower than that of the solder bump and which is below the temperature at which degradation of the adhesive layer occurs. This alloy is "tinned" on the contact pads of the substrate in such a manner that the alloy is in contact with the solder bumps of a chip when the chip is in position to be electrically connected to the substrate. When the chip is heated to a temperature above the melting point of the eutectic alloy, but below the melting point of the solder or the degradation point of the adhesive, the alloy mixes with the solder such that the composition of the material at the interface of the solder and eutectic alloy is altered and the melting point of the molten interface mixture progressively increases. The chip is heated until the point at which the melting point of the mixture is higher than the temperature being maintained by the system. At this point, the mixture has solidified, and the chip is electrically connected to the substrate.

Though this improvement on the C-4 soldering technique overcomes the certain temperature related problems that exists with the traditional C-4 technique, a number of problems still exist which make this method less than desirable. First, the problems associated with flexible substrates utilizing adhesives to bond the copper foil to the polyimide film still exist. The operating temperature range of the assembly is still restricted, the assembly is still less resistant to solvents and moisture, and the assembly is still too sticky or too soft under certain operating conditions.

Secondly, the heating technique disclosed in Legg et al. introduces additional problems to the chip connection process. Chips are heated in the method by applying a thermode to the back side of each chip for a specified period of time. This method has the advantage of being able to apply uniform pressure to the back side of the chip, so as to ensure intimate contact of the solder bumps to the contact pads on the substrate. On the other hand, unnecessary thermal stress is induced on the chip, as heat is transmitted from the thermode directly to active devices on the chip. The heat must pass through the circuit before reaching the solder/alloy interface. Consequently, the tolerances and specifications of the chips used must be increased to allow them to withstand the increased thermal stress imposed by the thermode. Along with increased tolerances and specifications comes increased cost, so the method may be financially limiting for many applications.

Finally, using a thermode to heat individual chips can reduce productivity of the assembly process. The method requires a thermode to remain in fixed contact with each chip on a substrate for a time suitable to reflow the alloy and form an electrical connection of that chip to the substrate. For a typical printed circuit substrate having a large number of flip chips, the time to electrically connect all of the chips to the substrate can become significant. This has a tendency to decrease productivity, and consequently, increase the costs associated with the assembly process.

Many of the drawbacks to Legg et al. and the other prior art methods are therefore due to limitations of the substrates used. Many of the barriers imposed by these prior substrates on the prior art methods have been removed, however, by the introduction of adhesiveless flexible substrates. This advancement has opened the door for new methods which are not bound by the aforementioned substrate limitations.

One such adhesiveless flexible substrate is the Novaclad ® adhesiveless copper/polymer film substrate, which has eliminated weaknesses that have plagued traditional adhesive-based substrate without sacrificing the desirable properties of a flexible circuit material. Such a substrate is the subject of U.S. Pat. No. 5,112,462 to Swisher, assigned to the assignee of the present application. It is essentially a polyimide or polyester film with copper interconnection layers located on one or both sides, joined without the use of adhesives. The Novaclad ® substrate is produced by first exposing the polyester or polyimide film to a plasma comprising oxygen produced from a metallic electrode, which produces a metal-oxide treated film, and then forming the copper layers by a vacuum metalization process. The strength of the bond between the film and copper layers is primarily due to the formation of the metal-oxide on the film.

This adhesiveless flexible substrate allows the full thermal properties of the copper to be utilized. In addition, the adhesiveless flexible substrate is dimensionally stable as long as the thermal coefficient of expansion of the specific polyimide film used is carefully matched with that of copper. Finally, it overcomes the aforementioned limitations of ceramic and adhesive flexible substrates to provide an inexpensive, flexible substrate having a wide range of applications. Consequently, the need for a method of electrically connecting flip chips to a flexible substrate may be facilitated by the use of such an adhesiveless flexible substrate.

SUMMARY OF THE INVENTION

Flip chips can be assembled on a flexible printed circuit substrate with a method that incorporates the advantages of adhesiveless flexible substrates, while overcoming many of the problems with other prior art methods. In the method one or more flip chips, each having a number of solder bumps, is brought into registered contact with an active side of a flexible printed circuit substrate having an interconnection pattern and a number of solder paste bearing contact pads. The solder bumps are substantially hemispherically-shaped tin-lead solidified solder, located on the bonding pads of the flip chips. Some or all of these solder bumps have corresponding contact pads on the substrate to which the solder bumps will be electrically connected. Of the contact pads on the substrate, a group are active contact pads, each of which having a corresponding solder bump which is electrically connected to the active contact pad by the method. The rest of the contact pads are inactive contact pads, which are unaffected by the method.

In the method, a controlled sufficient volume of solder paste is applied to each active contact pad on the substrate, where each active contact pad corresponds to a solder bump located on a chip (By sufficient volume of solder paste, we mean the minimum volume of solder paste necessary to form an electrical connection between a solder bump and its corresponding active contact pad meeting the requirements for the application). Each chip is then placed on the substrate in registration with the circuit pattern to form an unsoldered assembly comprised of the chips and the substrate. Finally, the entire assembly is heated as a whole to induce reflow of the solder paste, such that each interconnect of solder and solder paste forms a secure electrical connection.

The method has several advantages. First, a flexible adhesiveless substrate is used, which is superior to ceramic substrates because of cost and substrate flexibility, and is superior to flexible adhesive-based substrates because it has a wider operating temperature range, it is not as sensitive to the adverse effects of solvents and moisture, and it does not have the tendency to become too sticky or too soft under certain operating conditions like its adhesive-based counterparts. Most importantly, the flexible adhesiveless substrate is not subject to the same adhesive temperature restrictions during the process of electrically connecting the chips to the substrate.

Additionally, the method uses a range of reflow ovens, being either of a type operating by direct infrared radiation, or by transmission of heat from a heated working fluid, to induce reflow of the solder paste during its heating step. Typically, the reflow oven used is either a infrared reflow oven, a vapor phase reflow oven, or a convection reflow oven. Unlike the thermode method of heating, all chips are electrically connected to the substrate simultaneously, as opposed to individually. On a typical substrate containing many chips, the simultaneous heating of each solder bump-solder paste junction may be several orders of magnitude faster than an individual heating method, which has a significant impact on the overall productivity of the assembly process.

Also, as opposed to the thermode method of heating, the reflow oven process does not induce significant stress to the chips during assembly. In the thermode method, as described above, heat is transferred directly to the chips, and most significantly, through the active components on the chips, before reaching the solder bumps. Because of the increased stress imposed by the thermode method, the chips themselves must be constructed to higher tolerances and specifications, which tends to limit the availability of the process to less cost-critical applications. In contrast, the reflow oven process of the present invention places less stress on chips during the heating of the assembly, so chips built to less exacting standards may be used, and consequently, the method of the present invention is useful in a wider variety of applications.

The method is also advantageous in that the quality of the electrical connections formed during the heating step meet or exceed many of the prior art methods. Unlike many prior art soldering methods, the chips self-align during reflow, that is, each solder bump on a chip self-aligns precisely over its corresponding contact pad on the substrate. This property is enabled in part because the chips are unrestrained during reflow, so that the surface tension present in the reflowed solder compositions is able to draw the chips into their proper positions. Also, through an additional step of coating the completed assemblies with a low stress epoxy encapsulant after the heating step, assemblies produced by the method are able to obtain electrical connections which meet the automotive thermal cycling requirement of 1000 thermal cycles from −65° C. to 150° C.

In a preferred embodiment of the invention, the method also has an advantage of being able to be implemented using standard automated surface mount technology (SMT) equipment. The step of providing solder paste to active substrate contact pads is performed using a stenciling process, whereby a stencil is computer generated to provide etched openings corresponding to active substrate contact pads, and the solder paste is printed onto the substrate through this stencil. This process allows for precise control over the application of solder paste to the active contact pads, which is critical to the success of the method. In addition, this process allows solder paste to be applied to all of the active contact pads on the substrate concurrently.

Additionally, the step of placing the chips on the substrate is well known in the art, and is quickly and reliably performed using high speed optical placement equipment.

The heating step is performed by passing the entire chip/substrate assembly through a carefully controlled reflow heating process. Such a process is computer controlled for such variables as heating rates, conveyor speed and alarms, and product specific recipes are developed and stored to insure repeatable reflow results. In addition, a nitrogen purge option is implemented in the infrared reflow oven to inhibit the formation of solder oxides during the process.

Additionally, the method of the present invention may further include a cleaning step, where the completed chip/substrate assembly is exposed to freon-based solvents and ultrasound processes.

Finally, like many prior art methods, the method of the present invention provides for substrates containing multiple flip chips, attached in a low profile on either side of the substrate, and extending a minimum height from the substrate so that the completed assembly occupies the smallest possible volume.

BRIEF DESCRIPTION OF THE DRAWINGS

The above mentioned and other various features and advantages of this invention will become apparent from the following detailed description of the preferred embodiment in conjunction with the accompanying drawings, wherein:

FIG. 5b is a cross-sectional, enlarged fragmented view of the copper/solder interface in the electrical connection of FIG. 5a.

DETAILED DESCRIPTION OF THE PREFERRED EMBODIMENT

In the preferred embodiment of the present invention, a number of flip chips are electrically connected to an adhesiveless flexible printed circuit substrate. In addition to providing secure electrical connections between the flip chips and the substrate, the preferred embodiment of the invention incorporates automated processes to allow for higher tolerances, greater repeatability and higher productivity.

Figure 1A:
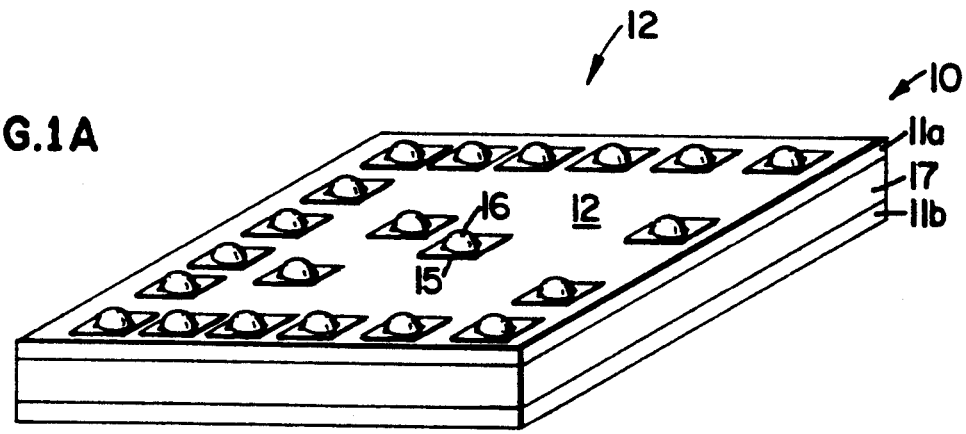
FIG. 1a is a perspective view of the active side of a flip chip.
Figure 1B:
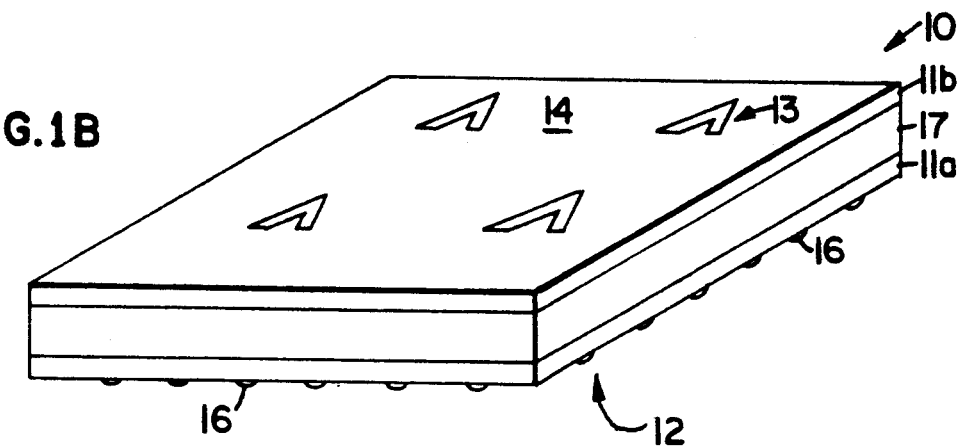
FIG. 1b is a perspective view of the back side of a flip chip.

Referring to FIGS. 1a and 1b, a flip chip is an unpackaged silicon integrated circuit chip, such as flip chip 10, having a silicon chip 17 containing the integrated circuit components and coated with an active side passivation layer 11a on the active side 12 to protect its components from environmental contaminants. It has markings 13 applied to its back side 14 for identification purposes, and a back side passivation layer 11b coated on back side 14 to protect the markings. It also has a number of aluminum/copper bonding pads, such as bonding pad 15, which are located at various positions on the flip chip's active side for making electrical connections with a substrate. Solder bumps, such as solder bump 16, are further attached to these bonding pads.

The solder bumps are attached to the bonding pads by a separate solder bump formation process which is typically performed during the manufacture of the flip chips. One skilled in the art will recognize that there are a number of solder bump formation processes available in the art. One of these processes is shown in FIGS. 2a-d and described below. These figures are simply illustrative of the process, and are not drawn to scale, i.e. they do not reflect the actual dimensions or surface features of the various layers in the process.

Figure 2A:
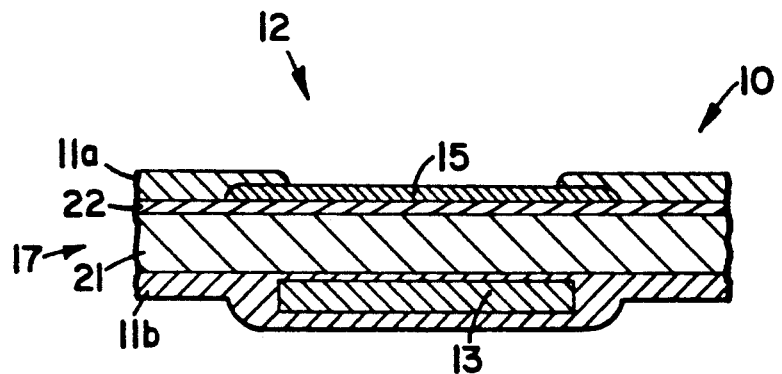
FIGS. 2a–d are sectional views of the formation of a solder bump on a flip chip.
Figure 2B:
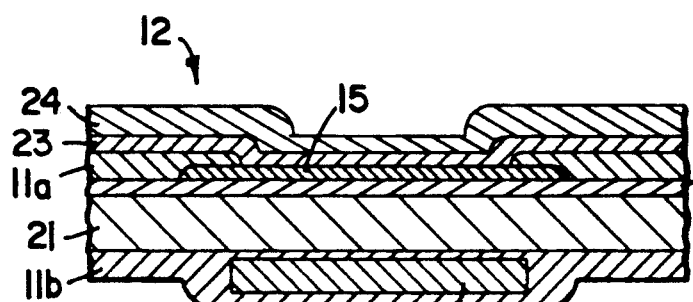
Figure 2C:
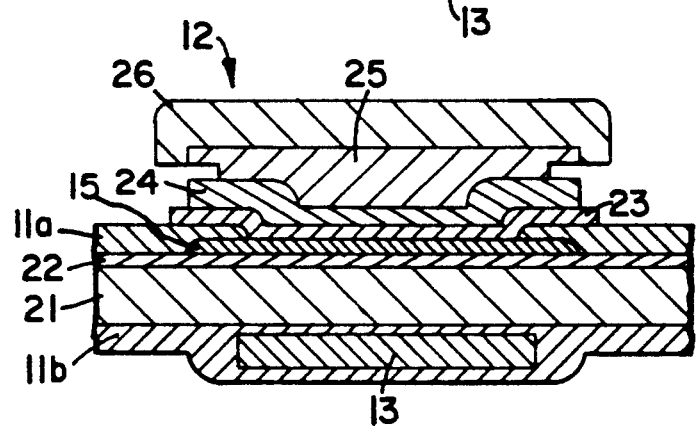
Figure 2D:
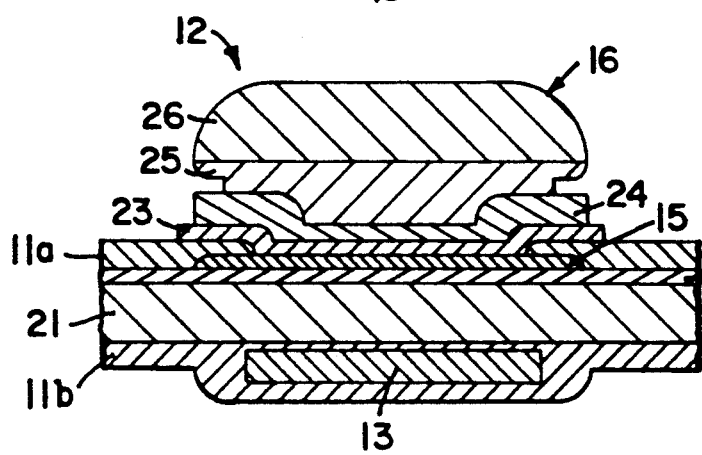

As shown in FIG. 2a, the flip chip 10 has a layer of silicon 21 and a layer of silicon oxide 22 which make up silicon chip 17. In this process, openings are cut into the active side passivation layer 11a of each of the flip chips on a wafer, to expose the bonding pads 15 located on active side 12 (FIG. 2a). Titanium/tungsten layer 23 and then copper layer 24 are sputtered onto the entire active side of the wafer (FIG. 2b). The sputtered titanium/tungsten layer promotes intermetallic adhesion, while the sputtered copper layer provides a surface to which an electroplated copper layer can attach. The continuous sputtered bilayer metallic sheet serves as the bus metal when the next two metal layers are electroplated over the bonding pads of the chip. Photoresist is then applied to the active side 12, and cuts are then made in the photoresist to expose the sputtered copper layer over the metal bonding pads. Copper 25 and then solder 26 is electroplated onto the exposed sputtered copper 24 (FIG. 2c). The photoresist layer is removed and the excess sputtered layers are wet etched away. Finally, the solder is heated and reflowed, to form a hemispherically-shaped solder bump 16 (FIG. 2d).

The solder bumps typically have compositions ranging between a 3:97 and a 10:90 tin/lead ratio, requiring reflow temperatures in the range of 320° C. In the preferred embodiment, solder bumps having a 6:94 tin/lead ratio are used, which have a reflow temperature of approximately 316° C., and which we have found optimize both joint adhesion and solder ductility. The solder bumps are also roughly hemispherical in shape, typically having a diameter of 9 mils (0.009") and a height of between 4 and 4.5 mils.

Figure 3A:
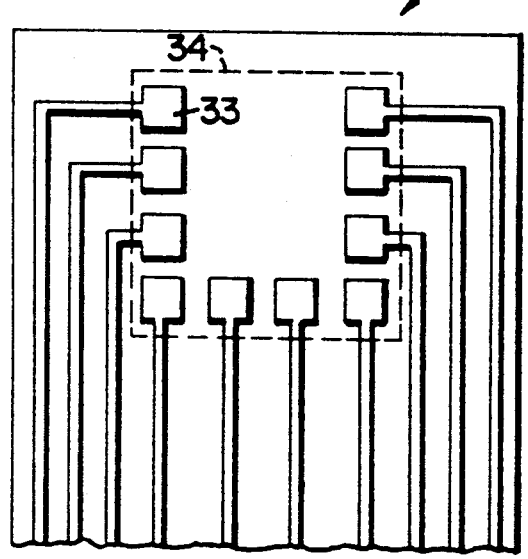
FIG. 3a is a sectional view of an active side of an adhesiveless flexible printed circuit substrate.
Figure 3B:
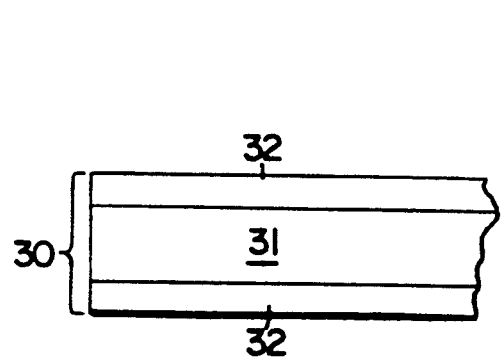
FIG. 3b is a cross-sectional view of an adhesiveless flexible printed circuit substrate.

Referring to FIGS. 3a and 3b, the adhesiveless flexible printed circuit substrate used is a Novaclad ® substrate 30. It essentially consists of a polyimide film 31 having copper layers 32 secured on one or both surfaces thereon.

Copper laminants 32 are securely bonded to film 31 through a process as described in U.S. Pat. No. 5,112,462 to Swisher, assigned to the same assignee as the present application. The process essentially consists of (1) treating a film with a plasma made up of ionized oxygen produced from a metallic electrode to form a metal-oxide treated film, and (2) forming metallized interconnection layers on this treated film, preferably either by vacuum metalization of metal, or by a combination of vacuum metalization of metal and an additional step of electroplating metal on top of the vacuum-deposited metal. The first step in this process produces a bonding surface on the film which is capable of securing metal interconnection layers which, unlike adhesive-based substrates, have excellent delamination resistance, even when exposed to heat, chemical treatment, mechanical stress or environmental stress. One skilled in the art, however, would also recognize that the method of the present invention is applicable in general to other members of the class of adhesiveless flexible printed circuit substrates, such as polyester-based substrates, and other substrates produced using different methods. One skilled in the art would also recognize that the method of the present invention is also applicable to adhesive-based substrates, particularly when suitable solder pastes having reflow points within the tolerance ranges of the adhesive-based substrates be used.

Novaclad ® substrates offer significant advantages over adhesive-based flexible substrates. They are less sensitive to adverse effects of solvents and moisture and don't have the tendency to become too sticky or too soft under certain operating conditions. Most importantly, they have a much wider range of operating temperatures due to the lack of the temperature-sensitive adhesives.

Novaclad ® substrates also offer a significant advantage over ceramic substrates because the material polyimide is carefully matched to silicon to provide minimal shear force exposure to chips mounted on the substrate. The thermal coefficient of expansion of a polyimide substrate ($80 \times 10^{-7}$ (° /C.)) is roughly similar to that of an alumina substrate ($65 \times 10^{-7}$ (° /C.)); however, the modulus of polyimide substrate ($61.8 \times 10^4$ psi) is several orders of magnitude lower than that of the alumina substrate ($37 \times 10^6$ psi). These properties of the polyimide substrate significantly reduce the formation of any damaging shear forces, during heating/cooling cycles, between the chip and the substrate which could fracture the interconnects. The shear forces for a silicon flip chip connected to a polyimide substrate are:

$$E_{substrate} \times (TCE_{substrate} - TCE_{silicon\ die}) = psi/°\ C.$$

$$(61.8 \times 10^4\ (psi)) \times (65 \times 10^{-7}\ (°\ /C.) - 30 \times 10^{-7}\ (°\ /C.)) = 3.09\ psi/°\ C.$$

This value for Novaclad° substrates (3.09 psi/° C.) is significantly lower than for a comparable ceramic substrate (129.5 psi/° C.). Therefore, when subjected to thermal cycling, the Novaclad ® substrate subjects the electrical connections to significantly less shear force than prior ceramic substrates.

On the active side of the substrate 30, the copper layers 31 contain an interconnection pattern for the circuit to be assembled, with a number of contact pads, such as contact pad 33, defined thereon, corresponding to the connection footprints, such as footprint 34, for the flip chips which may be connected to the substrate. As a substrate containing one interconnection pattern may be useful for more than one assembled circuit, and as a flip chip may be useful for more than one assembled circuit, it is not required that every contact pad correspond to a solder bump or vice versa.

Active contact pads are the contact pads on the substrate which do have corresponding solder bumps. These active pads are the only contact pads which are electrically connected to solder bumps by the method of the present invention.

The first step of the method is to provide solder paste to each of the active contact pads on the substrate. The solder paste typically is a composition of solder in a carrier matrix of flux. The particular composition is chosen to have a viscosity value for easy registration of the paste through the stencil and onto the substrate, while having a solder content sufficient to form electrical connections with the flip chips. The solder paste chosen for a preferred embodiment is ALPHA WS-601 solder paste, manufactured by Alphametals of Jersey City, N.J. This preferred paste is a 90% metal material having a viscosity around 900 kcps, which is typically lower than most solder pastes due to the smaller openings in the stencil that are required for the method of the present invention. The flux used in this paste is a halide free, neutralized organic acid flux system, which allows for easy and thorough residue removal.

The solder composition in the paste is a 63:37 eutectic alloy of tin:lead formed in spherical particles having diameters no larger than 45 microns. The particles must be smaller than those in most solder paste, due to the smaller openings in the stencil that are required for the method of the present invention. Solder having this composition of materials has a reflow temperature in the range of 183° C.

Another solder paste which is compatible with another preferred embodiment of the invention is a 90% metal composition having 700 kcps viscosity, with the solder composition in the paste being a 63:35:2 eutectic alloy of tin:lead:silver formed in spherical particles having diameters no larger than 45 microns. Solder having this composition of materials has a similar reflow temperature, in the range of 182° C.

One skilled in the art will appreciate that various other compositions of solder paste may be used in the method of the present invention, such as solder pastes produced by Kester or Multicore, for example. Due to the lack of temperature constraints on the Novaclad ® substrate, the solder alloy is not limited to eutectic compositions having low melting points as required by adhesive based flexible substrates, such as in the Legg et al. reference. Compositions of solder which have reflow temperatures which are below, or which meet or exceed that of, the solder bumps on the flip chips may be used in the method of the present invention.

Lower temperature solder compositions, such as those used in the above preferred embodiments, have the advantage of being used with a wide variety of electrical components. This is due primarily to the fact that reflow of these compositions induces less thermal stress on electrical components, so more standard components are capable of withstanding the reflow process.

On the other hand, the use of higher temperature solder compositions in the method of the present invention provides further advantages. One such advantage is the ability for the method of the present invention to implement higher temperature reflow processes, such as vapor phase oven reflow processes using higher temperature vapor phase heat transfer solvents.

Another important advantage to the use of higher temperature solder compositions is that they may allow assemblies created using the method of the present invention to be more resistant to temperature exposure in high temperature applications. Though soldered connections formed by many prior art methods are unable to sustain high temperatures without reflowing, the higher temperature solder compositions capable of being implemented in the method of the present invention would require much higher temperatures in order to reflow. Therefore, assemblies having high temperature components electrically connected by the present invention's method would be capable of being used in a wide range of operating environments.

A preferred high temperature solder paste would have a solder composition similar to that of the solder bumps themselves, preferrably being tin-lead solder with a tin content between 3% and 10%, and more preferrably being tin-lead solder having 6% tin and 94% lead.

The volume of solder paste applied to each active contact pad is critical to the success of the method. This critical volume is dependent primarily on the area of the active contact pad, the connected distance between the substrate and the corresponding flip chip in final assembled form, and the volume of the corresponding solder bump. This volume may be found by subtracting the volume of the solder bump from the volume of the desired electrical connection (also called a solder filet) to obtain the desired volume of solder, and then calculating the volume of solder paste which would contain this volume of solder.

For the preferred embodiment, it was found that for solder bumps having a 9 mil diameter, for a 5 mil connected distance between the substrate and the flip chip, for a 12 mil contact pad diameter, and for a 90% metal composition of solder paste, the optimal volume of solder paste was approximately $6 \times 10^{-7}$ in$^3$.

In the preferred embodiment of the invention, the step of providing solder paste is performed by stencilling the solder paste onto the substrate through a stencil. The stencil is a brass sheet having etched openings to allow solder paste to pass through to register onto active contact pads. The etched pattern is produced from a CAD layer generated with the circuit artwork, making the pattern a perfect match to the substrate.

The stencilling step is an automated process, where fiducial registration is used to align the stencil with the substrate to provide precise registration of the solder paste on the substrate. Fiducial registration is provided by optical alignment, where first a camera finds fiducial marks (typically black dots in the center of black outlined circles) on both the stencil and the substrate, and then the stencil is aligned precisely over the substrate based upon the calculations of alignment errors found by the camera. The alignment of the stencil can be critical to the success of the method, as the stencil can not be off by more than a couple of mils given the size of the solder bumps (9 mil diameter).

After alignment of the stencil to the substrate, a quantity of solder paste is provided along the top surface of the stencil and a squeegee of specified hardness, speed, and pressure travels over the stencil to force the solder paste through the openings in the stencil and onto the active contact pads on the substrate. The stencil is then removed, leaving a substrate containing the precise amount of solder paste on each active contact pad.

The amount of solder paste provided to each active contact pad is dependent upon a number of factors during this step, so each must be carefully controlled to assure repeatable results for the method. Specifically, the volume of solder paste is primarily dependent upon the diameter of the etched opening, the thickness of the stencil, the pressure applied by the squeegee, the hardness of the squeegee, and the speed of the squeegee. The optimal values for these factors were found by using a test stencil of various thicknesses and opening diameters to register solder paste to a non-wettable polyimide substrate, reflowing the solder paste to form solder balls (as the solder could not wet to the substrate), and measuring the volume of the resulting solder balls. To provide the proper volume of solder paste for the preferred embodiment of the invention, it was found that a 4 mil thick stencil having 14 mil diameter openings was desired. It was found that the desired squeegee was a round squeegee having a 90 durometer hardness, travelling at a speed of 1.5 inches/second and applying a downward pressure of 22 psi to the stencil.

The second step of the method is to place each of the chips onto the substrate such that the solder paste on each active pad is in registration with the corresponding solder bump on a flip chip, to form an unsoldered chip/substrate assembly. In the preferred embodiment, optical placement equipment is used to place the chips one-by-one onto the substrate. Such equipment is computer-controlled, which allows for programs to be stored for each type of circuit to be assembled, to provide for completely automated chip registration.

This equipment places chips and other components which are provided in a tape and reel format; however, it is also capable of placing chips and components which are provided in other formats typically usable with automated placement equipment, such as in a waffle pack format. This equipment also uses the fiducial registration marks on the substrate to properly align the chips to the substrate before registration. The fiducial marks on the substrate are located by optical means prior to placement, so that the equipment can compensate for misalignment of the substrate in the equipment, as well as stretching, shrinkage or angularity variations between points on the substrate itself. The equipment has robotic arms which pick and place the parts on the substrate, and it also allows for the parts to be examined by a camera before placement on the substrate, to correct for x,y and rotational misalignment of the parts on the robotic arms.

The third step is to heat the chip/substrate assembly as a whole. The heating means used to affect this step is either of a type operating by direct infrared radiation, or by transmission of heat from a heated working fluid. By operation of the heating means in this step, the solder paste on every active contact pad reflows and forms an electrical connection with its corresponding solder bump, so that each chip is electrically connected to the substrate.

In the preferred embodiment, the heating means is an infrared (IR) reflow oven. The oven induces reflow of the solder paste by subjecting the unsoldered chip/substrate assembly to direct infrared radiation from both the top and bottom of the oven. In addition, the infrared reflow oven may have a nitrogen purge option in its heated zones, to inhibit the formation of solder oxides during reflow, and consequently, provide for a higher quality electrical connection.

In IR reflow ovens, the unsoldered chip/substrate assembly is placed on a palette and passed through the oven by a conveyor. The oven and conveyor are computer-controlled, which allows for precise control of heating rates, conveyor speed, and alarms. Product specific recipes may be stored in the computer, so that a carefully controlled and repeatable temperature profile for the reflow process of a particular assembly may be specifically tailored to the assembly, based upon such factors as materials used, component sizes, and component densities.

In operation, an unsoldered chip/substrate assembly is passed through the infrared reflow oven at a specific rates and temperatures, based upon the temperature profile for the particular assembly. The entire assembly is subjected to the heating means simultaneously, and heat reaches each of the solder paste/solder bump interfaces directly, so that reflow of the solder paste, and the subsequent formation of an electrical connection at each interface occurs concurrently.

This method is superior to the thermode method of heating first because of the decreased thermal stress imposed on the chips. As opposed to a thermode method of inducing reflow, heat reaches the solder paste/solder bump interfaces on the assembly directly, rather than through the active components of the chips. Consequently, the durability and performance requirements are not as substantial as they are for chips usable with the thermode method. Chips for use with the thermode method of heating must be constructed to high performance specifications, which, due to the increased costs involved, make that method unsuitable for many lower-cost applications. Chips for use with the method of the present invention, however, need not be designed and constructed with the same performance specifications, and therefore, the method ends up being significantly more cost-effective for a broader range of applications.

In addition, the reflow oven method is superior to the thermode method due to its increased productivity. In the thermode method, the thermode must remain in contact with a chip for a fixed period of time in order to reflow that chip. For an assembly having multiple chips, the time to reflow the entire assembly increases proportionally. On the other hand, the time to form electrical connections by the method of the present invention is reduced, as all connections between the chips and substrate are formed concurrently, rather than individually. In fact, as the number of chips on an assembly increases, the benefits of this method over the thermode method increase accordingly.

Figure 4:
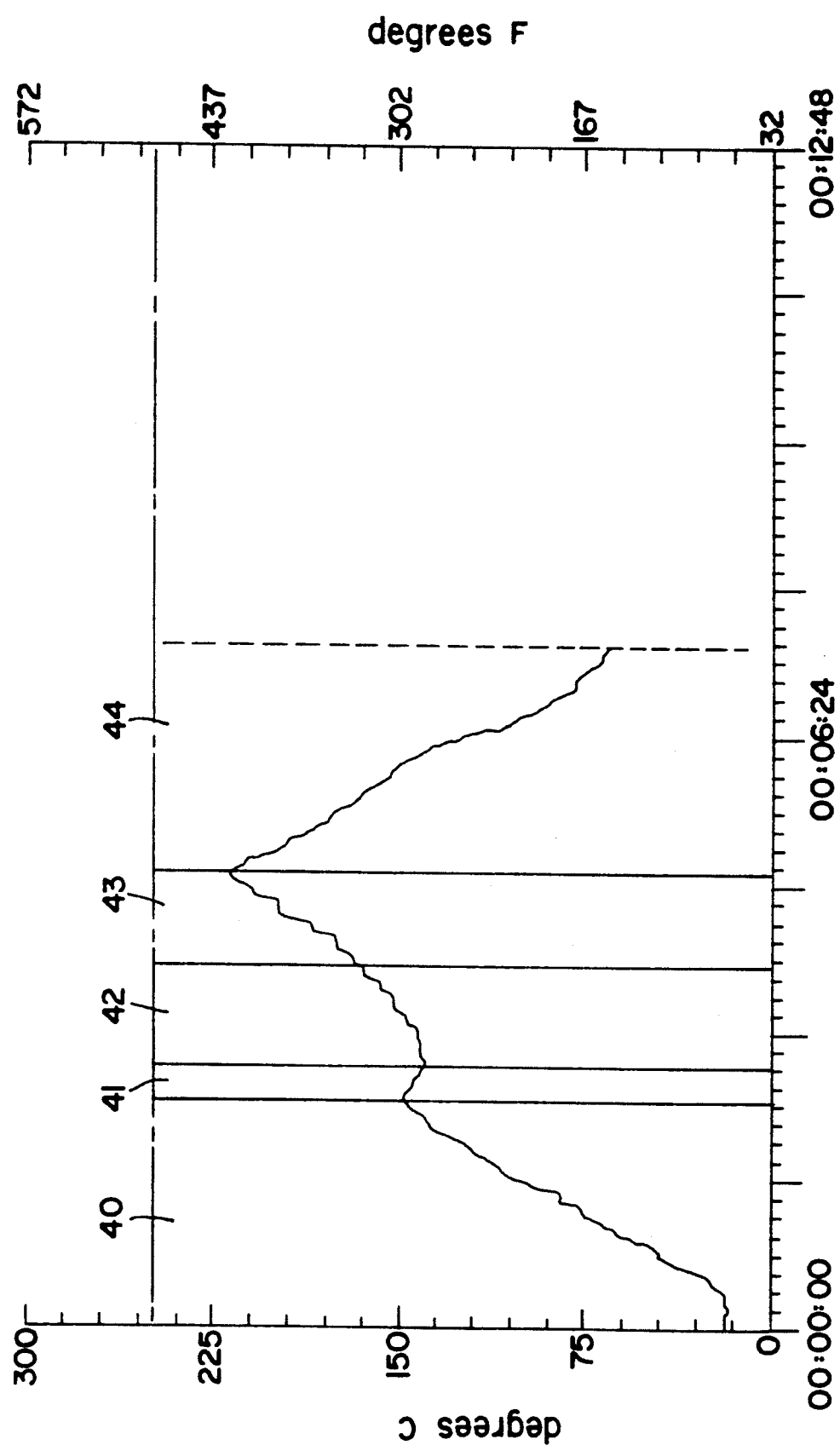
FIG. 4 is a graph of the temperature profile for a chip/substrate assembly during infrared reflow.

An IR reflow oven for use with the method of the present invention is divided into three heating zones, with individual control of heating from top and bottom. A preferred temperature profile is shown in FIG. 4. The assembly moves through each zone of the oven at the rate of 32.4 inches/minute. The first zone is the first preheat zone 40, which ramps the temperature of the assembly from the ambient temperature up to approximately 20°-30° C. below the reflow temperature of the solder in the solder paste (150° C. for the solder paste of the preferred embodiment). The purpose of this zone is to bring the assembly close to the reflow temperature without introducing shear forces generated by differing thermal coefficients of expansion of the various parts of the assembly, and to dry out the solder paste (i.e. remove the solvents). As such, it is desirable to keep the rate of temperature increase no greater than 2° C./second. Also, during this period, more heat may be applied from the bottom of the oven, in order to raise the temperature of the substrate and the palette at the same rate as the components on the top side of the substrate, as these parts have the most mass, and require more heat to be applied in order to raise their temperature. In the preferred embodiment, a short heat soak zone 41 may also be included before the second zone, where the heating is temporarily decreased in order for the entire assembly to reach the same temperature.

The second zone is the second preheat zone 42, which raises the temperature of the assembly to just below the reflow temperature of the solder (175°–180° C. for the solder paste of the preferred embodiment). The purpose of this zone is to activate and release the fluxes in the solder paste just prior to reflow, so that the solder is the only component left in the paste.

The third and last zone in the temperature profile is the reflow zone 43, which raises the temperature of the assembly above the reflow temperature of the solder, to a peak of approximately 40° C. above the reflow temperature (225° C. for the solder paste of the preferred embodiment). The purpose of this zone is to reflow the solder left from the solder paste to form the electrical connections. The peak must extend above the reflow temperature of the solder because the solder bump/contact pad interfaces are not subjected to direct IR due to their placement between the active side of the chips and the substrate. After this zone, the assembly enters a cooling zone 44 where the electrical connections are allowed to solidify and the assembly is allowed to return to ambient temperature.

Alternative heating means may also be effective when used in conjunction with the method of the present invention which, in lieu of subjecting the assembly to direct infrared radiation, transmit heat to the assembly through a heated working fluid. One alternative heating means is a convection reflow oven, in which heat is generated by heating elements and transmitted by convection through circulated air to the assembly. A similar temperature profile to the IR reflow profile of FIG. 4 would be used in such an oven, with corrections made for differing rates of heat, and for the fact that the solder bump/contact pad interface would be more directly exposed to the convection heating process.

Another alternative heating means is a vapor phase reflow oven, in which heat is also generated by heating elements, but is transmitted by convection through another working fluid which has its vapor point above the reflow temperature of the solder. One such fluid usable in a preferred embodiment of the invention is Fluorinert FC-70

Electronic Liquid manufactured by the 3M company of St. Paul, Minn., which has a boiling point of approximately 215° C. One skilled in the art, however, will appreciate that due to the increased temperature range of the method of the present invention, various other working fluids having lower or higher boiling points are capable of being implemented.

In this type of oven, the unsoldered assembly is moved by conveyor into a closed chamber, and the entire assembly is exposed to the high-temperature vapor. While the temperature of the assembly is below the vapor point of the working fluid, the fluid condenses on the assembly and transfers its heat to the assembly. Because the vapor must have a vapor point above reflow temperature, a different temperature profile is required for such an oven, and preheat cannot be accomplished through gradual heating. Therefore, this type of oven does not allow for the same degree of control of heating temperatures and rates as provided by the other two ovens, and is unable to prevent shear forces in the same manner. This type of oven is, in general, more demanding on the assemblies than the other ovens described above.

Preferably, an additional step may be applied to the completed assembly to decrease the probability of defects. The entire completed assembly may be cleaned using one of the commonly known cleaning techniques for printed circuit assemblies. The method of cleaning is of special importance to flip chip applications, because care must be taken to thoroughly clean between the chip and the substrate, as stray solder particles could become lodged in the gap and induce short circuits across electrical connections. The preferred method of cleaning involves cleaning the assembly with a freon-based solvent, such as any of the various liquid chlorofluorocarbon (CFC) solvents, or vapors of these materials, in order to dissolve and flush away solder flux residues. In addition the preferred method also includes the use of ultrasonic agitation of these solvents to improve the ability of the solvents to dissolve and flush away the residues. Examples of conventional freon-based solvents usable with the method of the present invention include Genesolv DFX distributed by Worum Chemical, or Freon solvents manufactured by DuPont. One skilled in the art will appreciate that other cleaning processes may be used, depending upon the particular solder paste and flux compositions used, such as semi-aqueous or fully aqueous solutions, with or without ultrasonic agitation.

It can be appreciated by those skilled in the art that the above processes may be implemented using currently-available surface mount technology (SMT) equipment. In addition, the various batch steps which operate on entire assemblies as a whole make this method suitable for high-volume production applications. The method is also very reliable and repeatable, and has a low defect rate, due to the precision and reliability provided by the standard SM equipment. Therefore, the method may be implemented in high-volume production with a relatively low manufacturing cost in comparison with many of the existing methods.

Figure 5A:
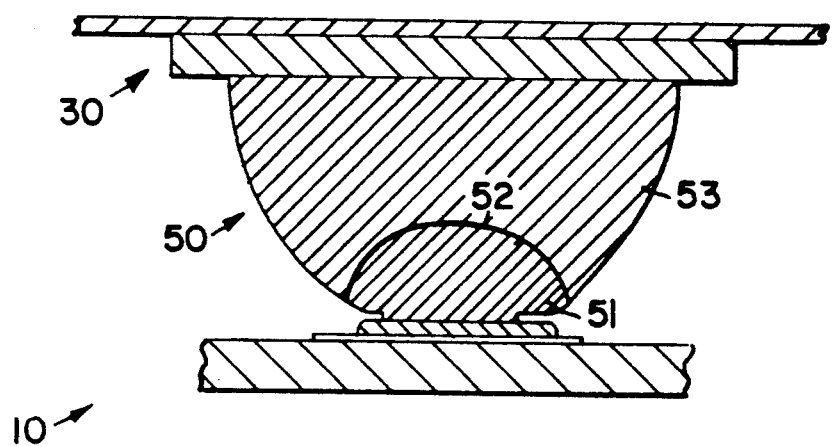
FIG. 5a is a cross-sectional view of an electrical connection between a flip chip and a substrate.
Figure 5B:
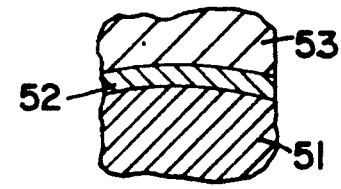

Referring to FIGS. 5a and 5b, the formation of the electrical connections, such as electrical connection 50, between a flip chip 10 and a substrate 30 is described. The figures, however, are merely representative of the compositions within the electrical connections, and are not drawn to scale. As described above, during the first two zones of the heating step, the solder paste is dried out (i.e. the solvents are removed) and its fluxes are activated, leaving only particles of solder on each contact pad. As the assembly reaches the reflow temperature, these particles liquify and form molten solder masses on the contact pads. At this point, the chip is suspended on the molten solder masses, and is allowed to self-align into its proper location and orientation on the substrate.

After the solder particles liquify, the solder bumps then begin to dissolve into the molten solder masses and form solder compositions of the solder from the bumps and the paste along the interfaces, because the solder in the solder bumps and the solder from the solder particles are readily miscible. As the assembly is further heated, the solder compositions in the interfaces between the solder bumps and the molten solder masses change due to the dissolution of the solder bumps, and the reflow point of the resulting solder compositions begin to increase. Eventually, homogeneous solder compositions 53 are reached, and electrical connections 50 solidify, because the reflow point has increased beyond the temperature of the assembly in the oven. At this point, the flip chip is electrically connected to the substrate. Also, an interface layer 52 is formed between solder 53 and the copper pedestal 51.

Electrical connections formed by the method of the present invention have in practice been stronger than the conventional C-4 soldering process used on ceramic substrates, as the shear forces required to dislodge the chips are typically higher for the method disclosed. Shear forces are typically measured using a cantilevered arm to apply a known force parallel to the substrate chip interface. In tests with identical chips, the chips mounted to the Novaclad ® substrate using the method of the present invention required an average of 1.6 kg of shear force to be dislodged as opposed to 1.3 kg for the same chips attached to a ceramic substrate. Therefore, the electrical connections formed by this method are in general superior to those formed by prior ceramic methods.

The strength of the connections can be attributed to a number of factors. The first is the fact that the reflow oven method of heating allows for unobstructed motion of the chips in relation to the substrate during reflow, so that the chips are allowed to self-align to their proper location and orientation on the substrate. Another factor is the composition of the solder paste, which we found produced electrical connections having a homogeneous mixture of solder throughout, with few undesired crystalline microstructures or other deformities.

Assemblies produced by the method of the present invention were also subjected to thermal cycling, in order determine the ability of the connections to withstand thermal stress. Test assemblies were placed in an air-to-air thermal chamber and cycled between $-65°$ C. and $150°$ C., remaining 20 minutes at each temperature and spending 20 seconds in transit between chambers. It was found that 75% of these assemblies had intermittent contacts, most formed along the tin-copper interface of an electrical connection (as shown in FIG. 5b), after 200 cycles.

However, it was found that adding a final step to the method of the present invention could be used to increase the ability of the flip chip connections to withstand thermal cycling. By coating the finished assembly with a low stress epoxy encapsulant, such as Hysol FP4510 manufactured by Dexter Electronic Materials of Industry City, Calif., chips electrically connected by the method of the present invention were able to withstand 1000 cycles of thermal exposure between $-65°$ C. and $150°$ C. in an air-to-air thermal chamber, remaining 20 minutes at each temperature and spending 20 seconds in transit between chambers, without the formation of intermittent contacts. The method thus meets the automotive thermal cycling requirement of 1000 cycles.

The thermal cycling performance of the method of the present invention can be attributed to a number of factors. The aforementioned self-alignment properties and choice of solder paste play a great role in this characteristic. In addition, the superiority of the Novaclad ® substrate over ceramic substrates is also significant. This is primarily because the shear forces from thermal expansion for the flexible substrate (3.09 psi/° C.) are significantly lower than those for the ceramic substrate (129.5 psi/° C.). Consequently, thermal changes tend to introduce less shear forces on chips mounted on a flexible substrate than those on a ceramic substrate, so the assemblies are better able to withstand thermal cycling.

The method of the present invention is thus useful for mounting flip chips to a flexible substrate in a reliable, cost-efficient manner. The electrical connections formed by the method meet or exceed the reliability and performance characteristics of those formed by most existing methods. In addition, due to the method's ability to form electrical connections without a great deal of thermal stress, less expensive, lower performance chips may be used in conjunction with the method, allowing it to be used in a wider variety of lower-cost and consumer applications. Also, the productivity of the method is preferred over many existing methods as many of the steps are batch processes which operate concurrently on entire assemblies. Finally, as the method may be implemented using standard surface-mount technology equipment, it may be incorporated into existing facilities at a reasonable cost.

In addition, due to the method's ability to incorporate higher temperature solder pastes, assemblies may be produced which have higher resistance to temperature, and which therefore may be used in a wide variety of specialized applications in more hostile operating environments. All that would be required in such circumstances would be flip chips which were capable of withstanding the increased operating temperatures.

Although the present invention has been described with reference to preferred embodiments, workers skilled in the art will recognize that changes may be made in form and entail without departing from the spirit and scope of the invention.

What is claimed is:

1. A method for electrically connecting a plurality of flip chips, each flip chip having two or more solder bumps, to a flexible printed circuit substrate having a plurality of contact pads, the method comprising the steps of:
   providing solder paste on a plurality of active contact pads on the flexible printed circuit substrate, each active pad having a corresponding solder bump on one of the plurality of flip chips, such that the solder paste on each active contact pad is of sufficient volume to facilitate an electrical connection between the active contact pad and the corresponding solder bump;
   placing the chips on the substrate to form an unsoldered chip-substrate assembly, such that the solder paste on each active contact pad is in registration with the corresponding solder bump; and
   heating the chip-substrate assembly as a whole with a heating means which operates by direct infrared radiation of the assembly or by transmission of heat to the assembly from a heated working fluid, such that the solder paste on each active contact pad reflows to form an electrical connection with the corresponding solder bump.

2. The method of claim 1, wherein the plurality of flip chips are unpackaged silicon chips having a passivation layer on an active side of the chips for protecting active devices located on the chips from environmental contaminants, and having solder bumps located on bonding pads located on the active side.

3. The method of claim 1, wherein the flexible printed circuit substrate is an adhesiveless flexible polyimide copper laminate 4. The method of claim 1, wherein the flexible printed circuit substrate is an adhesiveless flexible polyester laminate.

5. The method of claim 1, wherein the flexible printed circuit substrate is an adhesive-based laminate.

6. The method of claim 1, wherein each of the solder bumps is comprised of:
an electroplated copper pedestal attached to an active side of the flip chip; and
tin-lead solder having a tin content of between 3% and 10%, the tin-lead solder being hemispherically-shaped and attached to the copper pedestal such that the copper pedestal is substantially between the solder and the flip chip.

7. The method of claim 6, wherein the tin-lead solder is comprised of 6% tin and 94% lead and has a reflow point in the range of 316° C.

8. The method of claim 1, wherein the solder paste is comprised of solder particles in a carrier matrix of flux, the solder paste having 90% solder particles and 10% flux and having a viscosity of 700 kcps, and wherein the solder particles are comprised of a 63% tin, 35% lead and 2% silver eutectic alloy, formed into substantially spherically-shaped objects having a diameter less than 45 microns, and having a reflow point of in the range of 182° C.

9. The method of claim 1, wherein the solder paste is comprised of solder particles in a carrier matrix of flux, the solder paste having 90% solder particles and 10% flux and having a viscosity of 900 kcps, and wherein the solder particles are comprised of a 63% tin and 37% lead eutectic alloy, formed into substantially spherically-shaped objects having a diameter less than 45 microns, and having a reflow point of in the range of 183° C.

10. The method of claim 1, wherein the solder paste is comprised of solder particles in a carrier matrix of flux, the solder particles comprised of high temperature tin-lead solder having a tin content of between 3% and 10%.

11. The method of claim 1, wherein the providing solder paste step comprises stenciling the solder paste on the active contact pads on the substrate through a stencil having etched openings corresponding to the pads.

12. The method of claim 11, wherein the stencil is made of brass and has a thickness of 4 mils, and wherein the etched openings have a diameter of 14 mils.

13. The method of claim 11, wherein the solder paste is stencilled through the stencil and on the active contact pads by an automated stencilling machine having a round squeegee of 90 durometer hardness, the squeegee moving at 1.5 inches/second and applying a force of 22 psi.

14. The method of claim 1, wherein the providing solder paste step includes providing a volume of the solder paste, such that the volume of solder paste located on each active contact pad is optimized as a function of the area of the pad, the connected distance between the substrate and the corresponding flip chip, and the volume of the corresponding solder bump.

15. The method of claim 14, wherein the providing solder paste step includes providing $6 \times 10^{-7}$ cubic inches of solder paste on each active contact pad.

16. The method of claim 1, wherein the placing step comprises placing the chips on the substrate using an optical placement means.

17. The method of claim 1, wherein the heating means is from the group of: an infrared reflow oven, a vapor phase reflow oven, or a convection reflow oven.

18. The method of claim 17, wherein the heating means is an infrared reflow oven having a nitrogen purge option for inhibiting formation of solder oxides during the heating step.

19. The method of claim 18, wherein the heating step includes heating the assembly according to a temperature profile, the temperature profile comprised of
a first preheat zone for raising the temperature of the assembly from an ambient temperature to approximately 20°-30° C. below the reflow point of the solder paste;
a second preheat zone for raising the temperature of the assembly to just below the reflow point of the solder paste;
a reflow zone for raising the temperature of the assembly to approximately 40° C above the reflow point of the solder paste; and
a cooling zone for allowing the assembly to cool to ambient temperature.

20. The method of claim 19, wherein the assembly is moved through the oven at a rate of 32.4 inches/minute, and wherein the temperature of the assembly rises at a rate less than 2° C./second in the first preheat, second preheat, and reflow zones.

21. The method of claim 1, wherein the heating step includes forming the electrical connection of each of the chips to the substrate simultaneously 22. The method of claim 1, further comprising the step of coating the assembly with a low stress epoxy encapsulant after heating the chip-substrate assembly 23. The method of claim 1, further comprising the step of cleaning the assembly using freon-based solvents and ultrasound processes.

24. The method of claim 1, wherein the plurality of contact pads are located on both sides of the flexible printed circuit substrate and the plurality of flip chips are electrically connected to both sides of the flexible printed circuit substrate.

25. A method for electrically connecting a plurality of flip chips to a flexible printed circuit substrate having a plurality of contact pads located on either side of the substrate, each flip chip an unpackaged silicon chip having a passivation layer on an active side of the chips for protecting active devices located on the chips from environmental contaminants, and having two or more solder bumps located on bonding pads located on the active side, each solder bump comprised of an electroplated copper pedestal attached to the active side of the flip chip and tin-lead solder having 6% tin and 94% lead and having a reflow point in the range of 316° C., the tin-lead solder being hemispherically-shaped and attached to the copper pedestal such that the copper pedestal is substantially between the solder and the flip chip, the flexible printed circuit substrate comprised of an adhesiveless flexible polyimide copper laminate, the method comprising the steps of:
providing solder paste on a plurality of active contact pads on the flexible printed circuit substrate by stenciling the solder paste on the active contact pads on the substrate through a 4 mil thick brass stencil having 14 mil diameter etched openings corresponding to the pads, using an automated stencilling machine having a round squeegee of 90 durometer hardness, the squeegee moving at 1.5 inches/second and applying a force of 22 psi, the solder paste comprised of solder particles in a carrier matrix of flux, the solder paste having 90% solder particles and 10% flux and having a viscosity of 900 kcps, the solder particles comprised of a 63% tin and 37% lead eutectic alloy, formed into substantially spherically-shaped objects having a diameter less than 45 microns, and having a reflow point in the range of 183° C., each active pad having a corresponding solder bump on one of the plurality of flip chips, such that the solder paste on each active contact pad is of sufficient volume to facilitate an electrical connection between the active contact pad and the corresponding solder bump;

placing the chips on the substrate to form an unsoldered chip-substrate assembly using an optical placement means, such that the solder paste on each active contact pad is in registration with the corresponding solder bump;

heating the chip-substrate assembly as a whole with a heating means comprised of passing the assembly through an infrared reflow oven having a nitrogen purge option for inhibiting formation of solder oxides, at a rate of 32.4 inches/minute, and such that the temperature of the assembly rises at a rate less than 2° C./second, the heating performed in accordance with a temperature profile comprised of:

a first preheat zone for raising the temperature of the assembly from an ambient temperature to approximately 20°–30° C. below the reflow point of the solder paste;

a second preheat zone for raising the temperature of the assembly to just below the reflow point of the solder paste;

a reflow zone for raising the temperature of the assembly to approximately 40° C. above the reflow point of the solder paste; and a cooling zone for allowing the assembly to cool to ambient temperature;

such that the solder paste on each active contact pad reflows to form an electrical connection with the corresponding solder bump;

cleaning the assembly using freon-based solvents and ultrasound processes; and coating the assembly with a low stress epoxy encapsulant.

* * * * *